(12) United States Patent
Toh et al.

(10) Patent No.: US 8,831,529 B2
(45) Date of Patent: Sep. 9, 2014

(54) WIRELESS COMMUNICATIONS CIRCUITRY WITH TEMPERATURE COMPENSATION

(75) Inventors: Yuping Toh, San Francisco, CA (US); Anh Luong, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 211 days.

(21) Appl. No.: 13/460,718

(22) Filed: Apr. 30, 2012

(65) Prior Publication Data
US 2013/0288610 A1 Oct. 31, 2013

(51) Int. Cl.
*H04B 17/00* (2006.01)
*G01R 31/00* (2006.01)

(52) U.S. Cl.
USPC ............ 455/67.11; 324/750.01; 324/750.03

(58) Field of Classification Search
CPC ......... G01K 15/00; H04B 17/00; G01R 31/02
USPC .............. 455/67.11; 324/750.01–750.09
See application file for complete search history.

(56) References Cited

U.S. PATENT DOCUMENTS

| | | | | |
|---|---|---|---|---|
| 3,630,084 | A * | 12/1971 | McBride et al. | 374/109 |
| 5,027,064 | A | 6/1991 | Cripps | |
| 5,373,237 | A | 12/1994 | Imperato | |
| 5,663,638 | A | 9/1997 | Humpherys | |
| 6,415,858 | B1 | 7/2002 | Getchel et al. | |
| 8,437,793 | B2 * | 5/2013 | Donovan et al. | 455/522 |
| 2002/0050833 | A1 * | 5/2002 | Jones et al. | 324/760 |
| 2003/0040343 | A1 * | 2/2003 | Epperson et al. | 455/572 |
| 2003/0086476 | A1 * | 5/2003 | Mizuta | 374/178 |
| 2004/0203472 | A1 * | 10/2004 | Chien | 455/68 |
| 2005/0288052 | A1 * | 12/2005 | Carter et al. | 455/522 |
| 2007/0204672 | A1 * | 9/2007 | Huang et al. | 73/1.88 |
| 2008/0043887 | A1 * | 2/2008 | Simmons et al. | 375/345 |
| 2008/0164952 | A1 * | 7/2008 | Babitch | 331/66 |
| 2011/0301905 | A1 * | 12/2011 | Gregg et al. | 702/106 |
| 2013/0049777 | A1 * | 2/2013 | Wang et al. | 324/691 |
| 2013/0076381 | A1 * | 3/2013 | Takayanagi et al. | 324/750.03 |

OTHER PUBLICATIONS

Luong et al., U.S. Appl. No. 13/323,709, filed Dec. 12, 2011.

* cited by examiner

*Primary Examiner* — Andrew Wendell
*Assistant Examiner* — Cindy Trandai
(74) *Attorney, Agent, or Firm* — Treyz Law Group; Jason Tsai

(57) ABSTRACT

A test system for calibrating wireless electronic devices is provided. The test system may include a test host, a radio communication tester, and a temperature chamber in which an electronic device under test (DUT) may be tested. The DUT may include a temperature sensor for monitoring an internal temperature of the DUT and may include power amplifier circuitry for outputting radio-frequency test signals. The tester may be used to measure output power levels of the radio-frequency test signals when the DUT is operating at a given reference temperature and when the DUT is operating at target operating temperature levels other than the given reference temperature. Power amplifier output level offset compensation values may be computed by comparing output power levels measured at each of the target operating temperatures to output power levels measured at the given reference temperature and may be stored in the DUT prior to normal operation.

19 Claims, 11 Drawing Sheets

| OVEN TEMP (°C) | Ctemp (°C) | BAND | CHANNEL | MOD | GAIN MODE | GAIN INDEX | Dtemp1 (STEP 304) | Dtemp2 (STEP 312) | TX POWER (dBm) |
|---|---|---|---|---|---|---|---|---|---|
| 25 | 35 | B1 | C1 | 8PSK | 0 | 1 | 2373 | 2367 | 10.5 |
| 25 | 35 | B1 | C1 | GMSK | 0 | 1 | 2373 | 2367 | 8.1 |
| 25 | 35 | B1 | C1 | 8PSK | 0 | 2 | 2373 | 2367 | 12.4 |
| 25 | 35 | B1 | C1 | GMSK | 0 | 2 | 2373 | 2367 | 10.4 |
| 25 | 35 | B1 | C1 | 8PSK | 0 | 3 | 2373 | 2367 | 13.9 |
| 25 | 35 | B1 | C1 | GMSK | 0 | 3 | 2373 | 2367 | 12.4 |
| ... | | | | | | | | | |
| 25 | 35 | B1 | C1 | 8PSK | 0 | 31 | 2373 | 2367 | 33.5 |
| 25 | 35 | B1 | C1 | GMSK | 0 | 31 | 2373 | 2367 | 33.4 |
| ... | | | | | | | | | |

FIG. 6

| TARGET TEMP (°C) | OVEN TEMP (°C) | BAND | CHANNEL | MOD | GAIN MODE | GAIN INDEX | Dtemp1 (STEP 402) | Dtemp2 (STEP 408) | TX POWER (dBm) |
|---|---|---|---|---|---|---|---|---|---|
| 39 | 35.4 | B1 | C1 | 8PSK | 0 | 0 | 2317 | 2312 | 9.9 |
| 39 | 35.4 | B1 | C1 | GMSK | 0 | 0 | 2317 | 2312 | 7.5 |
| 39 | 35.4 | B1 | C1 | 8PSK | 0 | 1 | 2317 | 2312 | 12 |
| 39 | 35.4 | B1 | C1 | GMSK | 0 | 1 | 2317 | 2312 | 9.7 |
| 39 | 35.4 | B1 | C1 | 8PSK | 0 | 2 | 2317 | 2312 | 13 |
| 39 | 35.4 | B1 | C1 | GMSK | 0 | 2 | 2317 | 2312 | 12 |
| ... | | | | | | | | | |
| 39 | 35.4 | B1 | C1 | 8PSK | 0 | 31 | 2317 | 2312 | 33 |
| 39 | 35.4 | B1 | C1 | GMSK | 0 | 31 | 2317 | 2312 | 33 |

FIG. 9

WIRELESS COMMUNICATIONS CIRCUITRY WITH TEMPERATURE COMPENSATION

BACKGROUND

Electronic devices often contain wireless communications capabilities. For example, portable electronic devices are often provided with wireless local area network (WLAN) communications circuitry, cellular telephone communications circuitry, and satellite navigation system receiver circuitry such as Global Positioning System (GPS) receiver circuitry. Using wireless communications circuits such as these, a user may communicate with local and remote wireless networks and may receive signals from GPS satellites.

As an example, a cellular telephone may include cellular telephone transceiver circuitry that is used to make telephone calls. The cellular telephone transceiver circuitry includes power amplifier circuitry that is used to amplify radio-frequency (RF) signals so that the RF signals can be transmitted to a nearby base station. If care is not taken, a change in temperature resulting from operation of the power amplifier circuitry can adversely affect the cellular telephone's ability to transmit RF signals at desired output power levels.

Consider a scenario in which a cellular telephone transmits RF signals to a current serving base station when the cellular telephone has an internal temperature of 40° C. The transmitted signals may be received by the current serving base station at a satisfactory power level of −10 dBm. As the power amplifier circuitry transmits the RF signals to the base station and generates heat in the process, the internal temperature of the cellular telephone may increase over time. When the internal temperature of the cellular telephone reaches 55° C., the radio-frequency signals that are transmitted by the cellular telephone may be received by the current serving base station at an unacceptably low power level of −15 dBm. As shown in this example, a change in the internal temperature of the cellular telephone can degrade the wireless output capability of the cellular telephone.

It would therefore be desirable to be able to provide ways for operating a wireless electronic device while taking into account variations in the operating temperature.

SUMMARY

Electronic devices may include wireless communications circuitry for supporting wireless operation and may also include temperature sensing circuits configured to monitor device operating temperatures. The wireless communications circuitry within an electronic device may, for example, include transceiver circuitry, power amplifier circuitry, and antenna structures.

The transceiver circuitry may be used to generate radio-frequency signals. The power amplifier circuitry may be used to amplify the radio-frequency signals so that the radio-frequency signals may be radiated from the antenna structures at sufficiently high output power levels. The performance of the power amplifier circuitry may vary as the device operating temperature changes.

Such types of electronic devices may be calibrated using a test system to obtain power amplifier offset compensation values that compensate for the change in power amplifier performance across different device operating temperatures. In one suitable embodiment, the test system may include a test host (e.g., a personal computer), a radio-frequency communications tester (e.g., a universal radio communication tester), a power supply unit, and a test chamber (e.g., a temperature chamber).

During calibration, an electronic device under test (DUT) may be placed within the test chamber. The test host may configure the internal temperature of the test chamber to a selected reference temperature. The test host may then configure the DUT to transmit radio-frequency test signals to the radio communication tester (e.g., using different radio-frequency power amplifier gain settings at desired frequencies). The radio communication tester may receive the corresponding test signals and perform desired output power measurements. The output power measurements gathered while the test chamber is set to the reference temperature may serve as baseline output power measurements to which other output power measurements are compared during computation of the power amplifier offset compensation values. The test host may also obtain a temperature sensor output value from the DUT using the temperature sensing circuit. The sensor output value corresponding to the reference temperature may represent a baseline reference sensor output value from which other target device operating temperatures (sometimes referred to as target calibration temperature levels) may be computed.

The test host may compute target sensor output values corresponding to each target device operating temperature in a predetermined list of target device operating temperatures using the baseline reference sensor output value and a known temperature coefficient associated with the temperature sensing circuit. The test host may then adjust the temperature chamber so that the DUT is tested at each of the target device operating temperatures (e.g., the radio communication tester may be used to obtain output power measurements while the sensor output values are sufficiently close to the computed target sensor output values).

Output power measurements measured in this way may be compared to the baseline output power measurements to determine output power offset values as a function of device operating temperature. Offset values obtained in this way can be stored in the device as calibration data. During normal operation, the electronic device may adjust the wireless communications circuitry using the calibration data so radio-frequency performance is optimized across different device operating temperatures (as detected by the temperature sensing circuit).

Further features of the present invention, its nature and various advantages will be more apparent from the accompanying drawings and the following detailed description.

BRIEF DESCRIPTION OF THE DRAWINGS

FIG. 6 is a table showing illustrative test data gathered using at least some of the steps of FIG. 5 in accordance with an embodiment of the present invention.

FIG. 9 is a table showing illustrative test data gathered using at least some of the steps of FIG. 8 in accordance with an embodiment of the present invention.

DETAILED DESCRIPTION

This relates generally to electronic devices, and more particularly, to electronic devices having wireless communications capabilities.

Electronic devices that include wireless communications circuitry may be portable electronic devices such as laptop computers or small portable computers of the type that are sometimes referred to as ultraportables. Portable electronic devices may also be somewhat smaller devices. The wireless electronic devices may be, for example, cellular telephones, media players with wireless communications capabilities, handheld computers (also sometimes called personal digital assistants), remote controllers, global positioning system (GPS) devices, tablet computers, and handheld gaming devices. Wireless electronic devices such as these may perform multiple functions. For example, a cellular telephone may include media player functionality and may have the ability to run games, email applications, web browsing applications, and other software.

Figure 1:
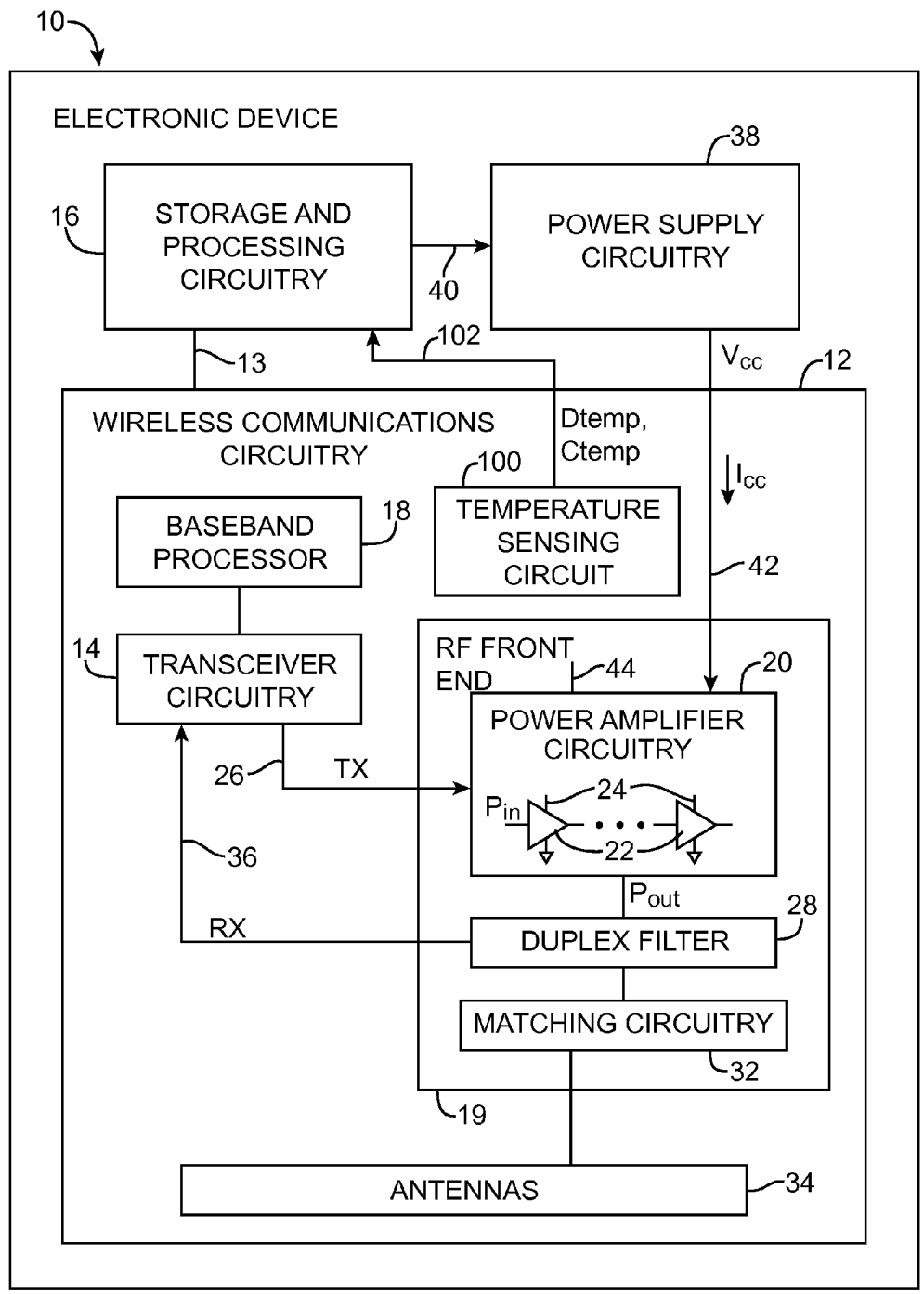
FIG. 1 is a diagram of an illustrative electronic device with wireless communications circuitry and a temperature sensor in accordance with an embodiment of the present invention.

FIG. 1 shows an illustrative electronic device that includes wireless communications circuitry such as wireless communications circuitry 12. As shown in FIG. 1, wireless communications circuitry 12 may include at least baseband processor 18, wireless transceiver circuitry 14, radio-frequency (RF) front end circuitry 19, and one or more antennas (antenna structures) 34. Front end circuitry 19 may include power amplifier circuitry 20, filter circuitry 28, impedance matching circuitry 32, and other suitable radio-frequency circuits. During signal transmission operations, transceiver circuitry 14 may supply radio-frequency signals that are transmitted by antennas 34. During signal reception operations, circuitry 14 may accept radio-frequency signals that have been received by antennas 34.

The antenna structures and transceiver circuits of device 10 may be used to support communications over any suitable wireless communications bands. For example, wireless communications circuitry 12 may be used to cover communications frequency bands such as cellular telephone voice and data bands at 700 MHz, 850 MHz, 900 MHz, 1800 MHz, 1900 MHz, and the communications band at 2100 MHz band, the Wi-Fi® (IEEE 802.11) bands at 2.4 GHz and 5.0 GHz (also sometimes referred to as wireless local area network or WLAN bands), the Bluetooth® band at 2.4 GHz, the Global Positioning System (GPS) band at 1575 MHz, and Global Navigation Satellite System (GLONASS) band at 1602 MHz.

Device 10 may be used to cover these communications bands and other suitable communications bands with proper configuration of the antenna structures in wireless communications circuitry 12. Any suitable antenna structures may be used in device 10. For example, device 10 may have one antenna or may have multiple antennas. The antennas in device 10 may each be used to cover a single communications band or each antenna may cover multiple communications bands. If desired, one or more antennas may cover a single band while one or more additional antennas are each used to cover multiple bands.

Device 10 may include storage and processing circuitry such as storage and processing circuitry 16. Storage and processing circuitry 16 may include one or more different types of storage such as hard disk drive storage, nonvolatile memory (e.g., flash memory or other electrically-programmable-read-only memory), volatile memory (e.g., static or dynamic random-access-memory), etc. Storage and processing circuitry 16 may be used in controlling the operation of device 10. Processing circuitry in circuitry 16 may be based on processors such as microprocessors, microcontrollers, digital signal processors, dedicated processing circuits, power management circuits, audio and video chips, radio-frequency transceiver processing circuits, radio-frequency integrated circuits of the type that are sometimes referred to as baseband modules, and other suitable integrated circuits.

Storage and processing circuitry 16 may be used in implementing suitable communications protocols. Communications protocols that may be implemented using storage and processing circuitry 16 include internet protocols, wireless local area network protocols (e.g., IEEE 802.11 protocols—sometimes referred to as Wi-Fi®), protocols for other short-range wireless communications links such as the Bluetooth® protocol, protocols for handling 2G cellular telephone communications protocols such as GSM (Global System for Mobile Communications) and CDMA (Code Division Multiple Access), 3G cellular telephone communications protocols such as UMTS (Universal Mobile Telecommunications System) and EV-DO (Evolution-Data Optimized), 4G cellular telephone communications protocols such as LTE, etc.

Data signals that are to be transmitted by device 10 may be provided to baseband processor 18 (sometimes referred to as a baseband module). Baseband processor 18 may be implemented using a single integrated circuit (e.g., a baseband processor integrated circuit) or using multiple integrated circuits.

Baseband processor 18 may receive signals to be transmitted via antennas 34 over path 13 from storage and processing circuitry 16. Baseband processor 18 may provide signals that are to be transmitted to transmitter circuits within transceiver circuitry 14. The transmitter circuits may be coupled to radio-frequency power amplifier circuitry 20 via a transmit (TX) path such as path 26. Path 13 may also carry control signals from storage and processing circuitry 16. These control signals may be used to control the power of the radio-frequency signals that the transmitter circuits within transceiver circuitry 14 supplies to the input of power amplifiers 20 via path 26. For example, the control signals may be provided to a variable gain amplifier located inside transceiver circuitry 14 that controls the power of the radio-frequency signals supplied to the input of power amplifiers 20. This transmitted radio-frequency signal power level is sometimes referred to herein as Pin, because it represents the input power to power amplifier circuitry 20.

During data transmission, power amplifier circuitry 20 may boost the output power of transmitted signals to a sufficiently high level to ensure adequate signal transmission. Filter circuitry 28 may contain a radio-frequency duplexer and other radio-frequency output stage circuitry such as radio-frequency switches and passive elements. Switches may, if desired, be used to switch the wireless circuitry between a transmitting mode and a receiving mode. Duplex filter 28 (sometimes referred to as a duplexer) may be used to route input and output signals based on their frequency.

Matching circuitry 32 may include a network of passive components such as resistors, inductors, and capacitors and may be used to ensure that antenna structures 34 are impedance matched to the rest of the wireless communications circuitry. Wireless signals that are received by antenna structures 34 may be passed to receiver circuitry in transceiver circuitry 14 over a receive (RX) path such as path 36.

Each radio-frequency power amplifier (e.g., each power amplifier in power amplifier circuitry 20) may include one or more power amplifier stages such as stages 22. As an example, each power amplifier may be used to handle a separate communications band and each such power amplifier may have three series-connected power amplifier stages 22. Stages 22 may have power supply terminals such as terminals 24 that receive bias voltages. Bias supply voltage may be supplied to terminals 24 using path 42. Control signals from storage and processing circuitry 16 may be used to selectively enable and disable stages 22 or to control the gain of individual stages using control path 44.

By enabling and disabling stages 22 selectively and/or adjusting the gain of individual stages separately, the power amplifier may be placed into different power modes. For example, the power amplifier may be placed into a high power mode (sometimes referred to as high gain mode) by enabling all three of power amplifier stages 22 or may be placed into a low power mode (sometimes referred to as low gain mode) by enabling two of the power amplifier stages. Other configurations may be used if desired.

For example, a very low power mode may be supported by turning on only one of three gain stages or arrangements with more than three power mode settings may be provided by selectively enabling other combinations of gain stages (e.g., in power amplifiers with three or more than three gain stages). In one suitable embodiment of the present invention, the gain of power amplifier circuitry 20 may be fine-tuned by adjusting a radio-frequency gain index (RGI). Incrementing the gain index may, for example, increase the amount of bias current that is provided to one or more of the stages to increase the gain and/or maximum power output of the power amplifier (e.g., control signals may be provided via path 44 that adjust the amount of bias currents provided to amplifiers 22 over path 42).

Figure 2:
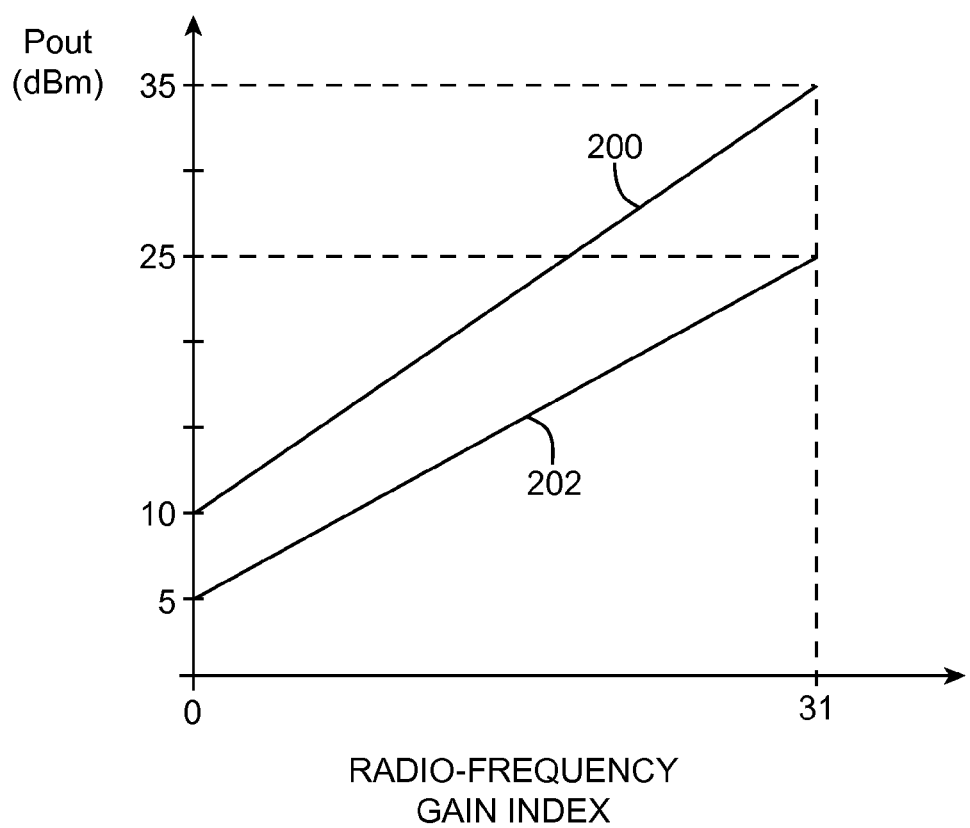
FIG. 2 is a plot of radio-frequency output power level versus radio-frequency gain index associated with the wireless communications circuitry in the electronic device of FIG. 1 in accordance with an embodiment of the present invention.

FIG. 2 is a plot showing output power level Pout for signals generated at the output of power amplifier circuitry 20 as a function of RGI. As shown in FIG. 2, characteristic curve 200 may represent output power levels for amplifier 20 operating in high gain mode, whereas characteristic curve 202 may represent output power levels for amplifier 20 operating in low gain mode. In this example, Pout may be monotonically increased from 5 dBm to 25 dBm as gain index is swept from 0 to 31 when amplifier circuit 20 is configured in low gain mode. When amplifier circuitry 20 is configured in high gain mode, Pout may be monotonically increased from 10 dBm to 35 dBm as gain index is raised from 0 to 31. The values as shown in FIG. 2 are merely illustrative. By adjusting the power mode and gain index of the amplifier, the output power capabilities of power amplifier circuitry 20 may be adjusted to maximize efficiency (e.g., for any given output power).

Device 10 may include adjustable power supply circuitry such as power supply circuitry 38. Adjustable power supply circuitry 38 may be controlled by control signals received over control path 40. The control signals may be provided to adjustable power supply circuitry 38 from storage and processing circuitry 16 or any other suitable control circuitry (e.g., circuitry implemented in baseband module 18, circuitry in transceiver circuitry 14, etc.).

The performance of wireless communications circuitry 12 may be affected by variations in device operating conditions. Consider a scenario in which device 10 includes a cellular telephone transceiver 14 that is being used to make a voice call (e.g., transceiver 14 is configured to transmit radio-frequency signals to a nearby cell tower). At the beginning of the voice call, the transmitted signals arriving at the nearby cell tower may exhibit satisfactory signal levels. Over time, however, power amplifier circuitry 20 that is being used to amplify the radio-frequency signals generates heat that can cause the internal temperature of device 10 (sometimes referred to as device operating temperature) to rise. As the device operating temperature rises, the efficiency of wireless communications circuitry 12 may be degraded, and signals transmitted from device 10 may no longer be received by the nearby cell tower at satisfactory signal levels (i.e., power amplifier circuitry 20 may experience an output power offset). It may therefore be desirable to have a way of monitoring the internal temperature of DUT 10 and to calibrate the performance of circuitry 12 across different operating temperatures (e.g., to obtain power amplifier output power offset compensation values that take into account variations in device operating conditions).

Device 10 may include a temperature sensing circuit such as temperature sensor 100. The example of FIG. 1 in which temperature sensor 100 is shown to be part of wireless communications circuitry 12 is merely illustrative. Temperature sensor 100 may, as an example, include a thermistor configured to output Dtemp and a reference clock temperature sensor configured to output temp. For example, temperature sensor 100 may produce a temperature dependent output value Dtemp that is proportional to the device operating temperature and may produce a temperature dependent output value Ctemp that is proportional to the temperature of a reference clock on the device. In one suitable embodiment of the present invention, sensor output value Dtemp may be output in the form of a digital signal. In other suitable embodiments, sensor output value Dtemp may be output in the form of an analog signal. Sensor outputs Dtemp and Ctemp may be fed to storage and processing circuitry 16 via path 102.

Storage and processing circuitry 16 may maintain a table of predetermined control settings or other stored information to be used in controlling power supply circuitry 38. The table may include a list of bias voltages (Vcc values) that are to be supplied by adjustable power supply circuitry 38 (as an example). Based on the known operating conditions of circuitry 20 such as its current gain settings (e.g., a high power mode or a low power mode), the desired output power value Pout to be produced by power amplifier circuitry 20 (e.g., the output power from amplifier circuitry 20 as measured at its output), the desired transmit frequency, the current device operating temperature as measured using temperature sensing circuit 100, and based on the values of the predetermined control settings in the table, storage and processing circuitry 16 may generate appropriate control signals on path 40 (e.g., analog control voltages or digital control signals).

The control signals that are supplied by storage and processing circuitry 16 on path 40 may be used to adjust the magnitude of the positive power supply voltage Vcc (sometimes referred to as the amplifier bias) that is provided to power amplifier circuitry 20 over path 42 (as an example). In other suitable arrangements, storage and processing circuitry 16 may generate appropriate control signals on path 44 that configure power amplifier circuitry 20 in the desired state. These adjustments may be made during testing and during normal operation of device 10 to help compensate for changes in the performance of wireless communications circuitry 12 across different device operating conditions (e.g., across different operating temperatures as measured by sensor 100, across different amplifier gain modes/settings, across different operating frequencies, across different radio access protocols, etc.).

Figure 3:
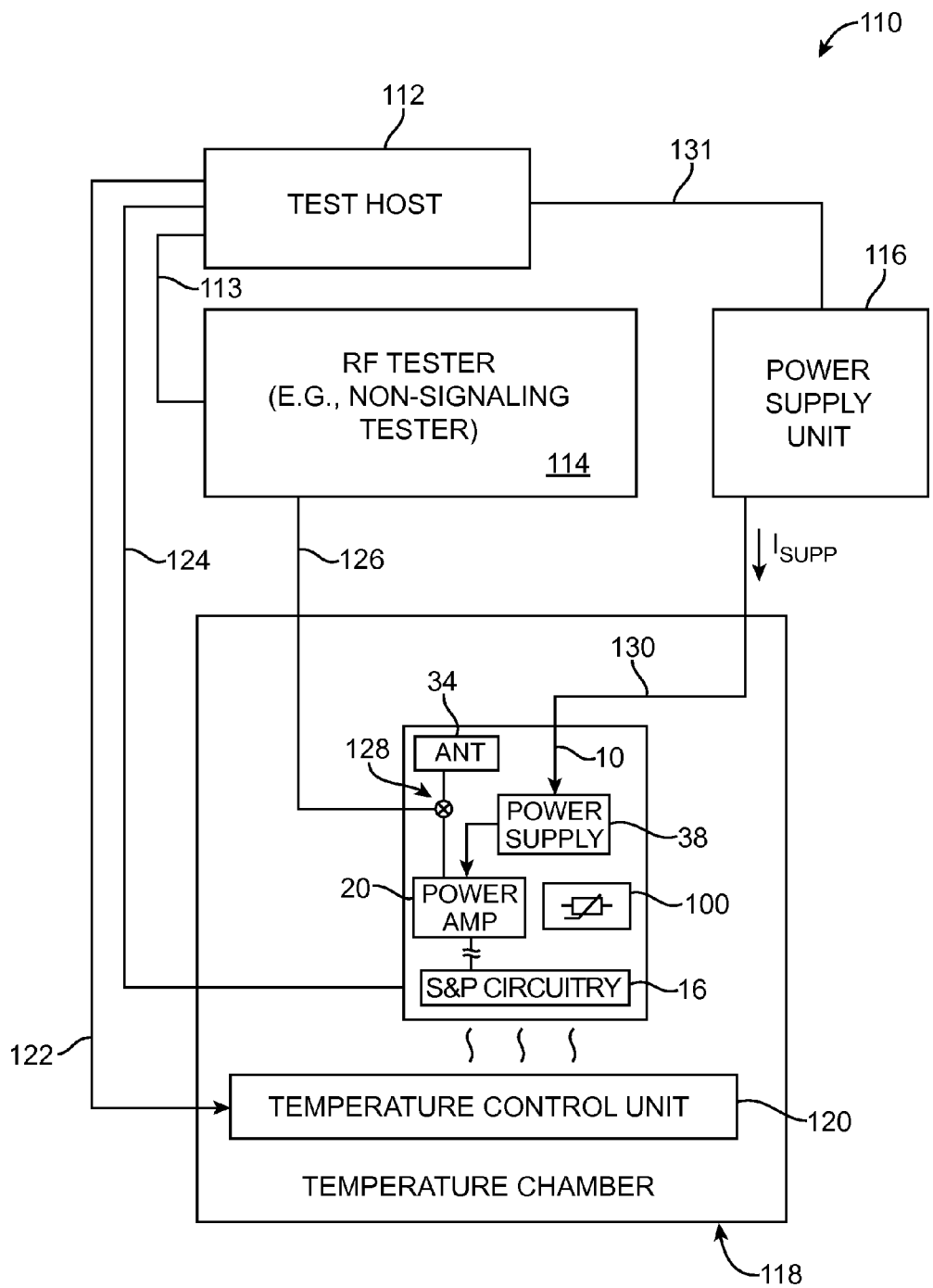
FIG. 3 is a diagram of an illustrative test system that includes a temperature chamber in which the electronic device of FIG. 1 can be calibrated in accordance with an embodiment of the present invention.

FIG. 3 is a diagram of an illustrative test system 110 that can be used to calibrate device 10. Device 10 being tested/calibrated may sometimes be referred to as a device under test (DUT). Test system 110 may include a test host such as test host 112 (e.g., a personal computer), a radio communication tester such as radio communication tester 114, a power supply unit such as power supply unit 116, a test chamber such as temperature chamber 118, control circuitry, network circuitry, cabling, and other test equipment.

DUT 10 may be placed within test chamber 118 during testing. Test chamber 118 may include a temperature control unit 120 that is used to regulate the temperature within test chamber 118. Temperature control unit 120 may be adjusted using control signals provided from test host 112 over path 122. For example, test host 112 may send first control settings to unit 120 that direct control unit 120 to heat up the internal temperature of chamber 118 to 73° C. As another example, test host 112 may send second control settings to unit 120 that direct unit 120 to cool down the internal temperature of chamber 118 to −9° C. Test chamber 118 may therefore sometimes be referred to as a test oven that provides a controlled user-specified oven temperature. In general, temperature control unit 120 may be configured to precisely set the temperature within test chamber 118 to any desired level.

As shown in FIG. 3, DUT 10 may be coupled to test host 112 via conducted path 124. The connection represented by path 124 may be a Universal Serial Bus (USB) based connection, a Universal Asynchronous Receiver/Transmitter (UART) based connection, or other suitable types of connections. Test host 112 may send control signals to DUT 10 over path 124 for directing the operation of DUT 10 during testing. For example, test host 112 may send commands to DUT 10 that configure power amplifier 20 in a selected gain mode, that configure transceiver circuitry 14 to generate radio-frequency signals using desired modulation schemes at desired frequencies, etc.

Power supply unit 116 may serve to supply power to DUT 10 during testing via path 130. In particular, power supply unit 116 can be used to monitor current Isupp that is drawn by DUT 10 during testing. Data reflective of the amount of current Isupp drawn by DUT 10 over time may be provided from power supply unit 116 to test host 112 via path 131. Monitoring current Isupp in this way ensures that DUT 10 does not consume excessive amounts of power when power amplifier circuitry 20 is operated under high gain settings. Current Isupp data gathered using this approach may also be useful when computing power amplifier output efficiency.

Radio communication tester 114 may, for example, be a radio communication tester (e.g., the MT8820 Universal Radio Communication Analyzer available from Anritsu) that is used to perform radio-frequency parametric tests for a variety of different radio-frequency communications bands and channels. DUT 10 may include a conductive member 128 interposed in a transmission line path connecting power amplifier circuitry 20 and antenna structures 34. Tester 114 may be coupled to conductive member 128 via a radio-frequency test cable 126 (e.g., a coaxial cable). Test cable 126 may make contact with member 128 of DUT 10 via mating radio-frequency connectors, via a test probe, or via other suitable coupling mechanisms.

Arranged in this way, antenna structures 34 may be decoupled from the remainder of the wireless communications circuitry while cable 126 is coupled to member 128, and tester 114 may be used to receive radio-frequency test signals generated at the output of power amplifier circuitry 20. Tester 114 may be used to analyze the RF test signals received from DUT 10. Test host 112 may retrieve the analyzed results via path 113. Test host 112 may then compute calibration values (e.g., temperature dependent power amplifier output offset compensation values) using the retrieved test data.

Test system 110 as shown in FIG. 3 is merely illustrative and does not serve to limit the scope of the present invention. If desired, test system 110 may include other means of controlling and monitoring the operating conditions of DUT 10, may include other types of radio-frequency test units for measuring the performance of DUT 10, and may include any other suitable test equipment.

Figure 4:
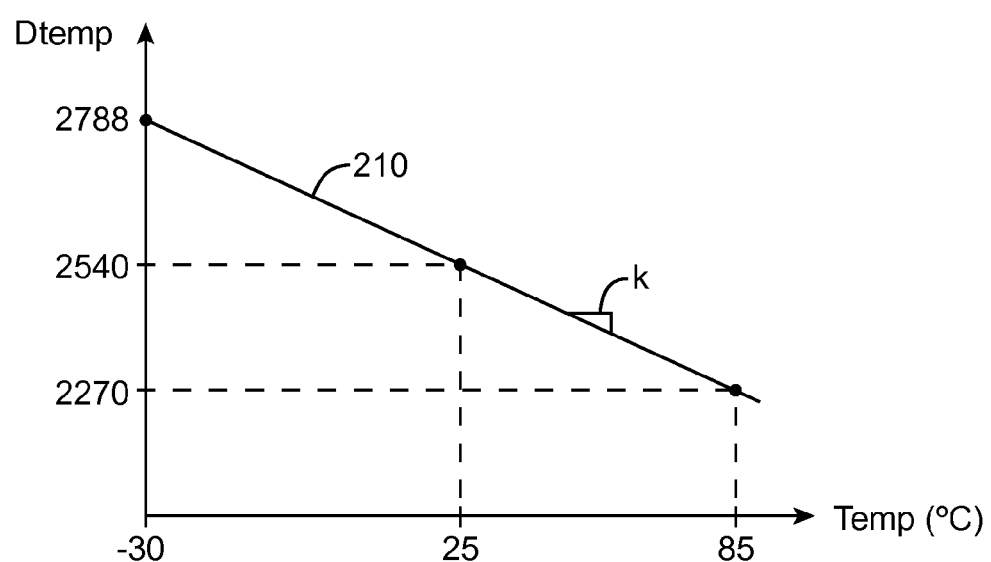
FIG. 4 is a plot of a temperature dependent sensor output value generated by the temperature sensor in the electronic device of FIG. 1 versus device operating temperature in accordance with an embodiment of the present invention.

FIG. 4 shows a plot of temperature sensor output value Dtemp as a function of temperature. As shown by line 210 in FIG. 4, Dtemp may decrease as temperature is increased. For example, a temperature of −30° C. may result in temperature sensor 100 generating a Dtemp of 2788; a temperature of 25° C. may result in temperature sensor 100 generating a Dtemp of 2540; and a temperature of 85° C. may result in temperature sensor 100 generating a Dtemp of 2270. In this example, temperature sensor 100 exhibits a temperature coefficient k of −4.5 (i.e., the slope of line 210 is equal to −4.5). The temperature coefficient k of temperature sensor 100 is generally a known, fixed value. By monitoring output value Dtemp, an accurate reading of the internal temperature of DUT 10 relative to a baseline temperature reading can therefore be obtained.

In the example of FIG. 4, consider a scenario in which sensor 100 outputs a Dtemp of 2405. If it is known that at a reference temperature of 25° C. corresponds to a baseline Dtemp equal to 2540, it can be determined that the current internal operating temperature of DUT 10 is equal to 55° C. ([2405−2540]/[−4.5]+25). Consider another scenario in which sensor 100 outputs a Dtemp of 2720. Using the known temperature coefficient of sensor 100 and the baseline temperature reading at 25° C., it can similarly be determined that the current internal operating temperature of DUT 10 is equal to −15° C. (([2720−2540]/[−4.5]+25). In other words, once a baseline temperature sensor reading is made at a reference temperature, the internal operating temperature of DUT 10 can be precisely computed using the baseline temperature output and the known temperature coefficient (e.g., the computed temperature values will be accurate relative to the reference temperature).

Figure 5:
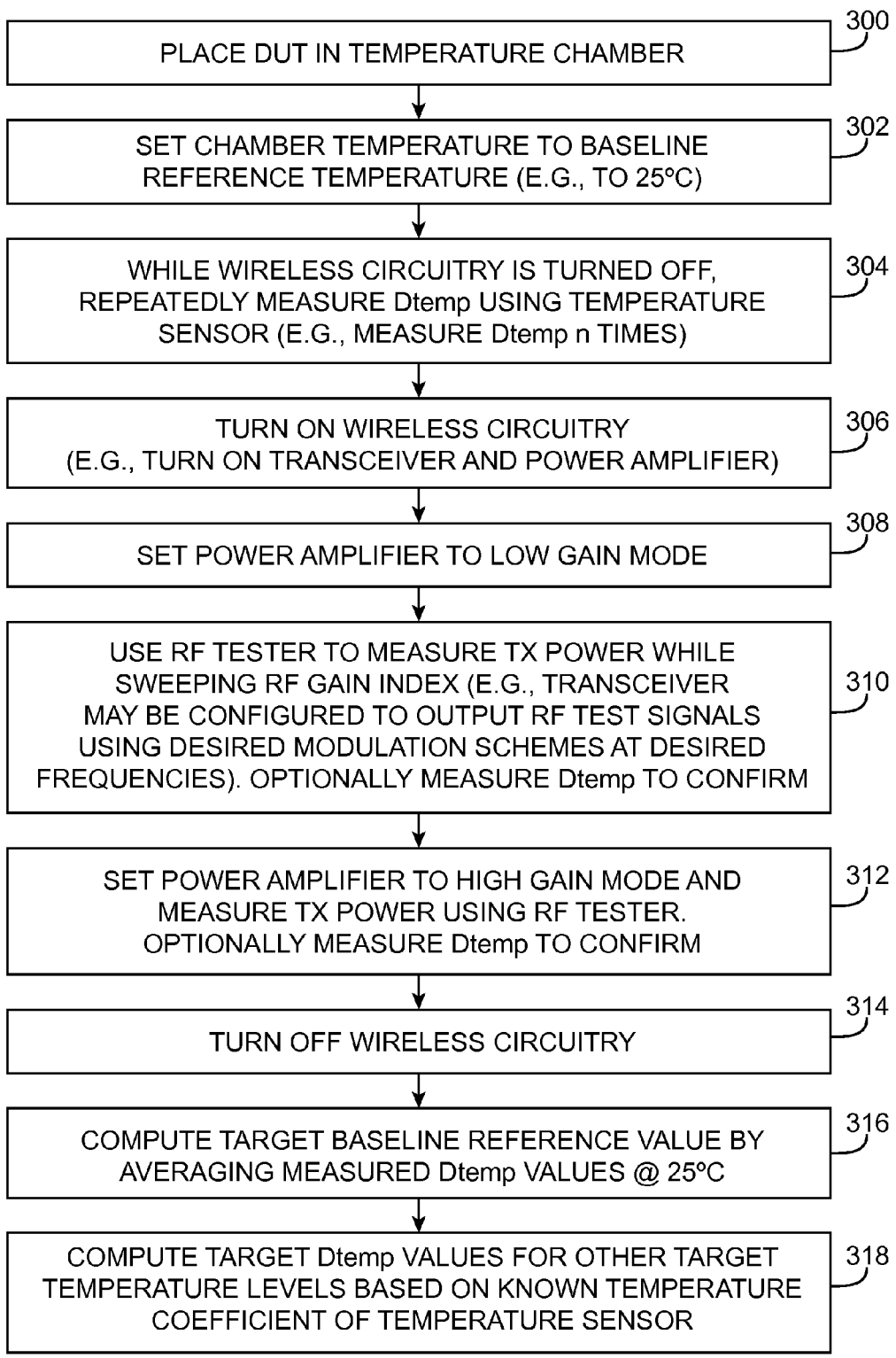
FIG. 5 is a flow chart of illustrative steps for computing target temperature sensor output values corresponding to respective target device operating temperatures in accordance with an embodiment of the present invention.

In computing output power offset compensation values for power amplifier circuitry 20, it may first be desirable to obtain baseline measurements at a selected reference temperature. FIG. 5 shows illustrative steps for obtaining baseline output power measurements at a reference temperature of 25° C. using test system 110 of the type described in connection with FIG. 3.

At step 300, DUT 10 may be placed within temperature chamber 118. At step 302, test host 112 may control temperature control unit 120 to set the internal temperature of chamber 118 to the reference temperature of 25° C. At step 304, DUT 10 may repeatedly record Dtemp and Ctemp measured using temperature sensor 100 while wireless communications circuitry 12 is turned off (e.g., n Dtemp measurements may be stored in circuitry 102 while transceiver circuitry 14 and power amplifier circuitry 20 are in an off state). Ctemp measurements may be used to compute an offset between the internal temperature of DUT 10 and the oven temperature.

At step 306, wireless communications circuitry 12 may be turned on (e.g., transceiver circuitry 14 and power amplifier circuitry 20 may be placed in an active transmission state). At step 308, test host 112 may configure DUT 10 so that power amplifier circuitry 20 is set to operate in the low gain mode (see, FIG. 2).

At step 310, a radio communication tester 114 may be used to measure the output power level of power amplifier circuitry 20 while sweeping the radio-frequency gain index from $RGI_{MIN}$ to $RGI_{MAX}$ (e.g., from 0 to 31). In particular, transceiver 14 may be configured to output radio-frequency test signals using desired modulation schemes (i.e., at different data rates) at desired frequencies (i.e., in different frequency bands and channels). If desired, DUT 10 may again record Dtemp to ensure that the internal temperature of DUT 10 has not changed by an unacceptable amount since step 304 (e.g., m Dtemp measurements may be stored in circuitry 102 after the output power levels have been measured using tester 114).

At step 312, test host 112 may configure DUT 10 so that power amplifier circuitry 20 is set to operate in the high gain mode, and tester 114 may be used to measure the output power level of power amplifier circuitry 20 while gain index is swept from $RGI_{MIN}$ to $RBI_{MAX}$ (e.g., the operations of step 310 may be repeated for characterizing the output efficiency of circuitry 20 in high gain mode). If desired, DUT 10 may again record Dtemp to ensure that the internal temperature of DUT 10 has not changed by an unacceptable amount since step 310.

At step 314, wireless communications circuitry 12 may be turned off (e.g., transceiver circuitry 14 and power amplifier circuitry 20 may be placed in the idle mode). At step 316, test host 112 may be used to compute a target baseline Dtemp for DUT 10 operating under an oven temperature of 25° C. by averaging measured Dtemp values gathered during steps 304, 310, and 312. At step 318, target Dtemp values for other target device operating temperature levels may be computed using only the computed baseline Dtemp and the known temperature coefficient k of temperature sensor 100.

FIG. 6 shows a table of illustrative transmit power measurements that can be gathered during step 310 of FIG. 5. As shown in FIG. 6, TX power levels can be recorded for signals transmitted in radio-frequency channel C1 in band B1 while sweeping RGI from 0 to 31, where the transmitted signals are modulated using 8 Phase Shift Keying (8PSK) and Gaussian Minimum Shift Keying (GMSK) digital modulation schemes, and where power amplifier circuitry 20 is configured in low gain mode (i.e., circuitry 20 has a gain mode value of zero). Values Dtemp1 may represent an average value computed using the n Dtemp measurements obtained at step 304. Values Dtemp2 may represent an average value computed using the m Dtemp measurements obtained at step 312. The transmit power levels measured at the reference oven temperature of 25° C. may represent baseline transmit power levels from which offset compensation values can be computed.

The values shown in FIG. 6 are merely illustrative. In general, test system 110 may be configured to obtain TX power level measurements for any number of radio-frequency channels in any number of radio-frequency bands, for radio-frequency signals transmitted using any desired frequency modulation schemes (e.g., for radio-frequency signals modulated using Binary Phase Shift Keying (BPSK), Quadrature Phase Shift Keying (QPSK), 16 Quadrature Amplitude Modulation (16-QAM), 64-QAM, etc.), and for any number of power amplifier gain settings (e.g., when power amplifier circuitry 20 is configured in a low gain mode, in a high gain mode, or in any intermediate gain modes and when power amplifier circuitry 20 is adjusted across different radio-frequency gain index settings).

Figure 7:
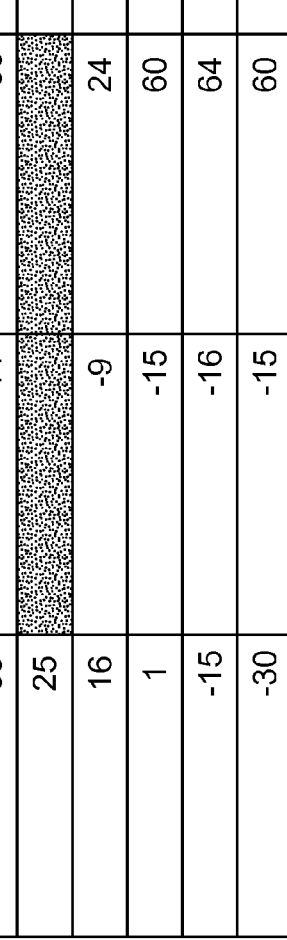
FIG. 7 is a table of computed target temperature sensor output values in accordance with an embodiment of the present invention.

FIG. 7 is a table that includes target operating temperatures levels and corresponding target sensor output values Dtemp that can be computed during steps 316 and 318 of FIG. 5. At step 316, the target Dtemp corresponding to an operating temperature of 25° C. (i.e., the reference temperature) may be computed by averaging at least Dtemp1 and Dtemp2 (see, FIG. 6). The resulting target Dtemp value of 2370 ([2373+ 2367]/2) as shown in FIG. 7 may represent the baseline Dtemp from which all other target Dtemp values are computed.

The values listed in column 350 may represent a predetermined list of target operating temperatures under which DUT 10 should be calibrated. These values may therefore sometimes be referred to as target calibration temperature levels. The list of target temperature values in FIG. 7 ranges from −30° C. to 85° C. and is meant to cover a wide range of operating conditions for device 10. The values listed in column 352 represent incremental changes in temperature from one target operating temperature to the next. The values listed in column 354 may be computed by multiplying the ΔTEMP values of column 352 by the known temperature coefficient k of temperature sensor 100. In this example, the temperature coefficient k of sensor 100 is equal to −4.0. For instance, the change in Dtemp (ΔDtemp) corresponding to the target temperature of 39° C. may be equal to −56 (14*−4), whereas ΔDtemp corresponding to the target temperature of −15 may be equal to 64 (−16*−4).

At step 318 of FIG. 5, the target Dtemp values may be calculated by adding the computed ΔDtemp values to the baseline Dtemp value of 2370. For example, the target Dtemp corresponding to the target operating temperature of 70° C. may be equal to 2190 (2370−56−60−64). As another example, the target Dtemp corresponding to the target operating temperature of 1° C. may be equal to 2454 (2370+24+ 60). Target Dtemp values corresponding to each of the values listed in column 350 may be computed in this way. The values of FIG. 7 are merely illustrative. In general, the temperature coefficient of sensor 100 may be any positive or negative constant, and target Dtemp values may be computed using this approach for any number (or range) of desired target operating temperatures.

Once the target Dtemp values have been computed, test system 110 may be used to measure the TX output power levels for DUT 10 at each of the target operating temperatures. At step 400 of FIG. 8, test host may direct temperature control unit 120 to set the temperature within chamber 118 to a selected target temperature other than the reference temperature (e.g., the oven temperature may be set to 39° C.).

At step 402, sensor 100 may be used to measure Dtemp n times. The measured Dtemp values may be fed to test host 112. Test host 112 may compute an average Dtemp based on the measured Dtemp values. Test host 112 may determine whether the average Dtemp value is sufficiently close the target Dtemp corresponding to the target temperature currently selected for calibration. If the magnitude of the difference between the average Dtemp and the target Dtemp exceeds a predetermined threshold, test host 112 may adjust temperature control unit 120 accordingly until the difference between the average Dtemp and the target Dtemp is less than the predetermined threshold.

At step 404, Dtemp measurements may be read back from DUT 10, and wireless communications circuitry 12 may be turned on (e.g., transceiver circuitry 14 and power amplifier circuitry 20 may be placed in an active transmission state). At step 406, test host 112 may configure DUT 10 so that power amplifier circuitry 20 is set to operate in the low gain mode.

At step 408, tester 114 may be used to measure the output power level of power amplifier circuitry 20 while sweeping the radio-frequency gain index from $RGI_{MIN}$ to $RGI_{MAX}$ (e.g., from 0 to 31). In particular, transceiver 14 may be configured to output radio-frequency test signals using desired modulation schemes (at different data rates) at desired frequencies (in different frequency bands and channels). If desired, DUT 10 may again record Dtemp to ensure that the internal temperature of DUT 10 has not changed by an unacceptable amount since step 402 (e.g., m Dtemp measurements may be stored in circuitry 102 after the output power levels have been measured using tester 114).

At step 410, test host 112 may configure DUT 10 so that power amplifier circuitry 20 is set to operate in the high gain mode, and tester 114 may be used to measure the output power level of power amplifier circuitry 20 while gain index is swept from $RGI_{MIN}$ to $RBI_{MAX}$ (e.g., the operations of step 408 may be repeated for characterizing the output efficiency of circuitry 20 in high gain mode). If desired, DUT 10 may again record Dtemp to ensure that the internal temperature of DUT 10 has not changed by an unacceptable amount since step 408.

At step 412, wireless communications circuitry 12 may be turned off (e.g., transceiver circuitry 14 and power amplifier circuitry 20 may be placed in the idle mode). Processing may loop back to step 400 if there are additional target temperatures levels for which DUT 10 should be calibrated, as indicated by path 414.

Figure 8:
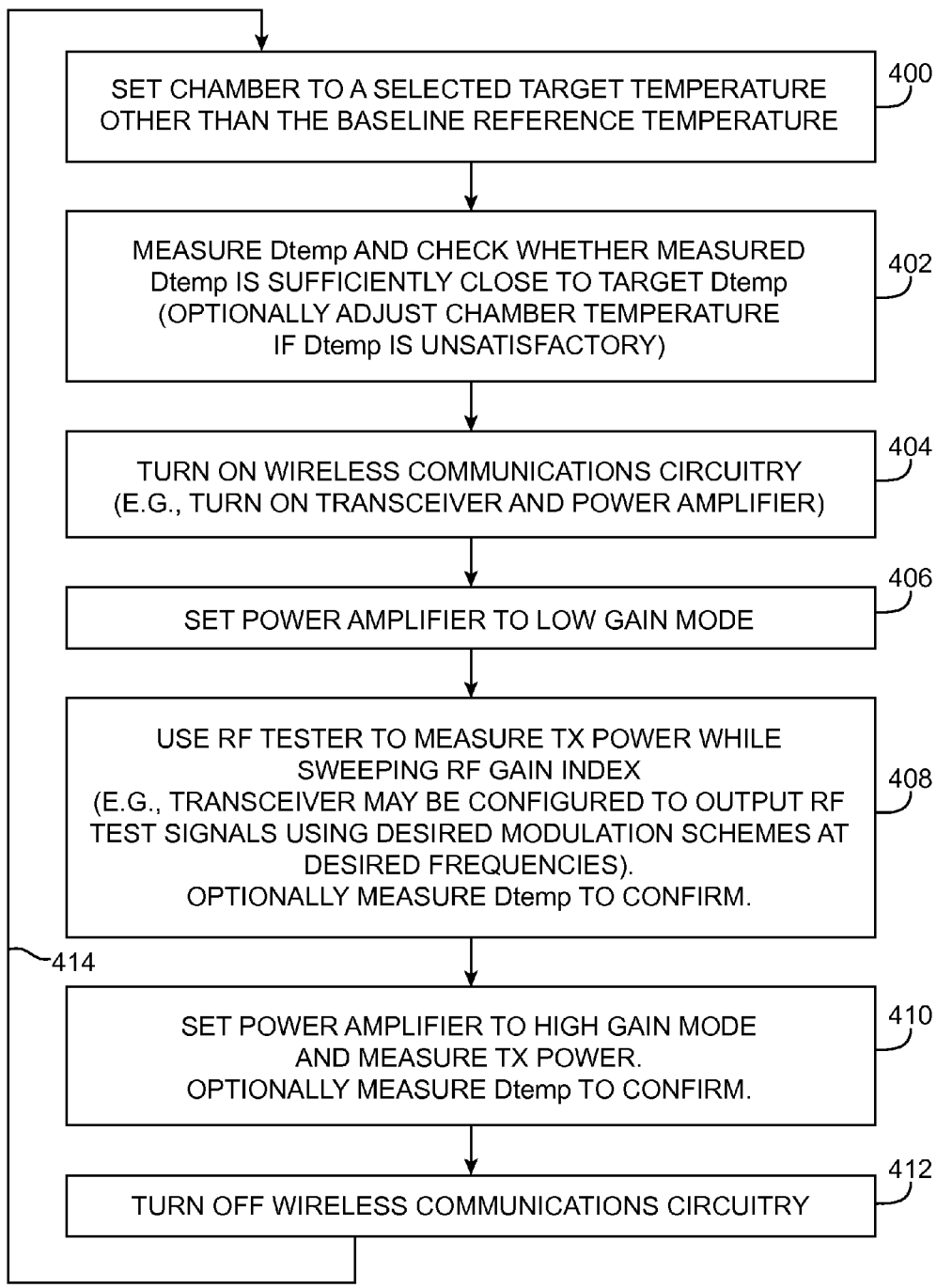
FIG. 8 is a flow chart of illustrative steps for using the test system of the type shown in FIG. 3 to measure radio-frequency output power levels at each target device operating temperature in accordance with an embodiment of the present invention.

FIG. 9 shows a table of illustrative transmit power measurements gathered during step 408 of FIG. 8. These values may be measured at the same transmit settings as those described in connection with FIG. 6 except at a new target operating temperature. Notice that to achieve a target temperature of 39° C., the oven temperature may only be set to 35.4° C. so that Dtemp1 and Dtemp2 are sufficiently close to the target Dtemp of 2314 (see, FIG. 7). In general, the TX power levels measured at higher temperatures (e.g., temperatures greater than 25° C.) tend to be lower than the baseline TX power levels measured at 25° C., whereas the TX power levels measured at lower temperatures (e.g., temperatures less than 25° C.) tend to be higher than the baseline power levels measured at 25° C. Test data may be gathered in this way for each of the target operating temperatures using test system 110.

Figure 10:
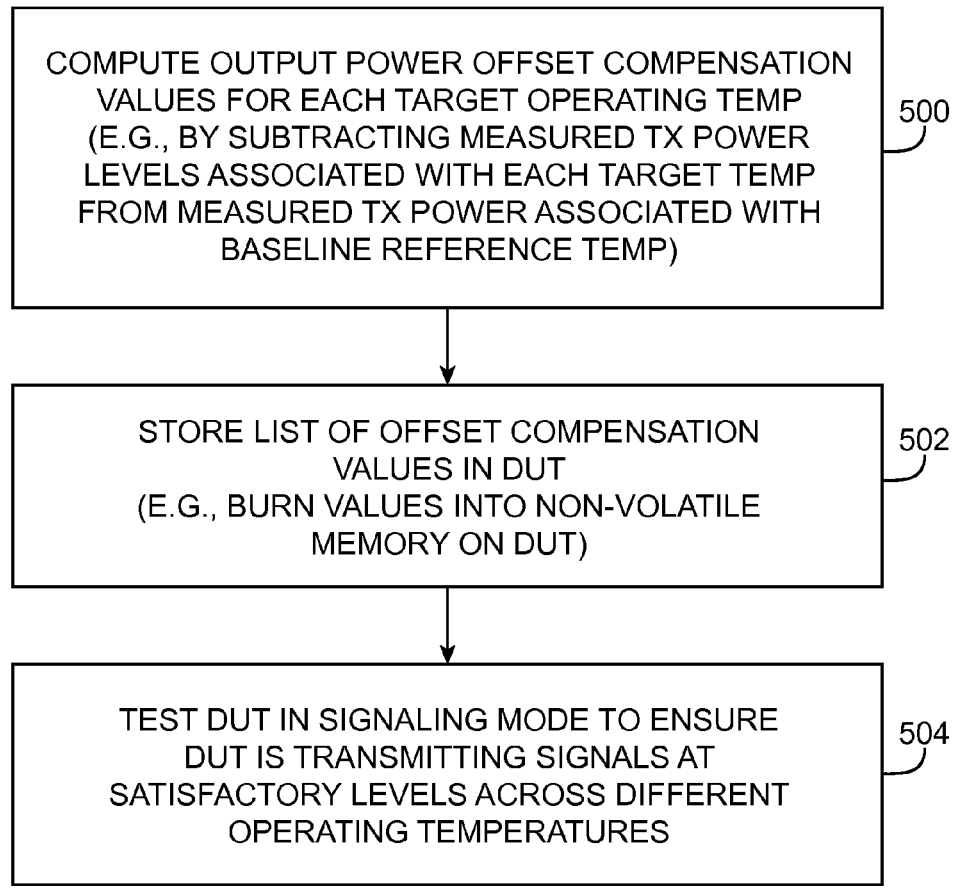
FIG. 10 is a flow chart of illustrative steps for computing temperature dependent output power offset compensation values in accordance with an embodiment of the present invention.
Figure 11A:
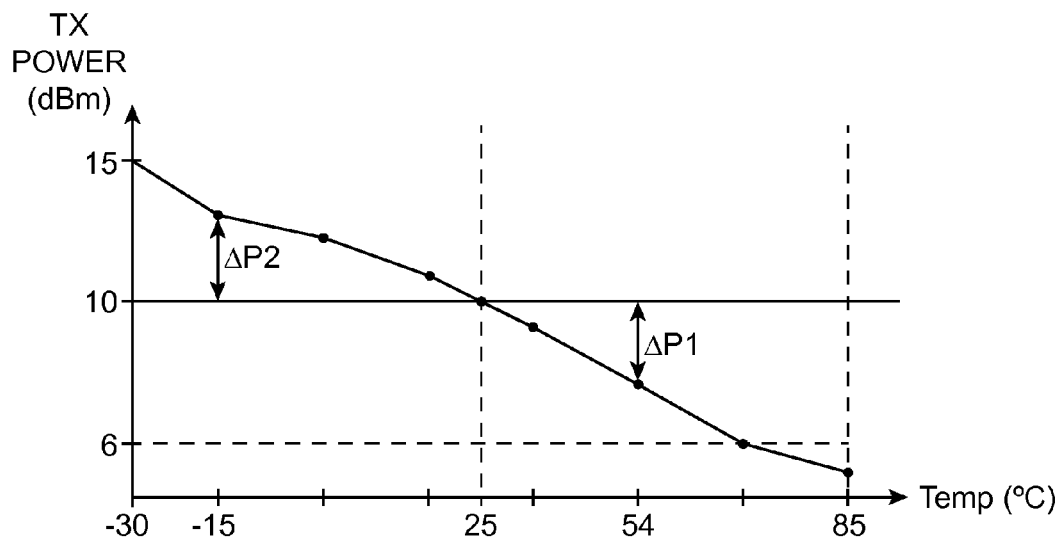
FIG. 11A is a plot showing how radio-frequency output power levels measured using the steps of FIG. 8 may vary as a function of device operating temperature in accordance with an embodiment of the present invention.

When test data has been gathered for each of the target operating temperatures, the illustrative steps of FIG. 10 can be performed. At step 500 of FIG. 10, test host 112 may be used to compute power amplifier output power offset compensation values for each of the target operating temperatures. The output power offset compensation values may, for example, be calculated by subtracting the measured TX power level associated with each target temperature from the baseline TX power level (i.e., the measured TX power level associated with the reference temperature). As shown in FIG. 11A, an offset $\Delta P1$ may be computed for the target operating temperature of 54° C., whereas an offset $\Delta P2$ may be computed for the target operating temperature of –15° C. (e.g., the amount of offset at each target temperature can be obtained by computing the difference between the measured TX power at each of the target temperatures and the measured TX power at the reference temperature).

At step 502, the computed offset compensation values may be stored in DUT 10 (e.g., the offset compensation values may be burned into non-volatile memory that is part of storage and processing circuitry 16). At step 504, DUT 10 may be configured in signaling mode (e.g., DUT 10 may communicate with a radio communication tester by establishing a protocol-compliant communications link with the radio communication tester) to ensure that DUT 10 is transmitting signals at satisfactory output power levels during normal user operation.

Once DUT is loaded with the offset compensation values, DUT 10 may control power amplifier circuitry 20 based on these compensation values while continuously monitoring its operating temperature using temperature sensor 100. As an example, consider a scenario in which sensor 100 in DUT 10 generates Dtemp indicating that the current operating temperature of DUT 10 is equal to 25° C. DUT 10 may retrieve a corresponding offset compensation value of zero from non-volatile memory 16 and may configure power supply circuitry 38 to supply power amplifier circuitry 20 with a nominal power supply voltage of 1.0 V (see, e.g., FIG. 11B).

As another example, consider a scenario in which sensor 100 in DUT 10 generates Dtemp indicating that the current operating temperature of DUT 10 is equal to 54° C. DUT 10 may retrieve a corresponding offset compensation value of –2 (reflective of a power amplifier efficiency degradation) from non-volatile memory 16 and may therefore configure power supply circuitry 38 to supply power amplifier circuitry 20 with a proportionally elevated power supply voltage of 1.1 V.

As another example, consider a scenario in which sensor 100 in DUT 10 generates Dtemp indicating that the current operating temperature of DUT 10 is equal to 16° C. DUT 10 may retrieve a corresponding offset compensation value of 1 (reflective of a power amplifier efficiency improvement) from non-volatile memory 16 and may therefore configure power supply circuitry 38 to supply power amplifier circuitry 20 with a proportionally reduced power supply voltage of 0.96 V. Generally, offset compensation values corresponding to temperature levels other than the target operating temperatures may be interpolated or extrapolated based on the measured data.

Figure 11B:
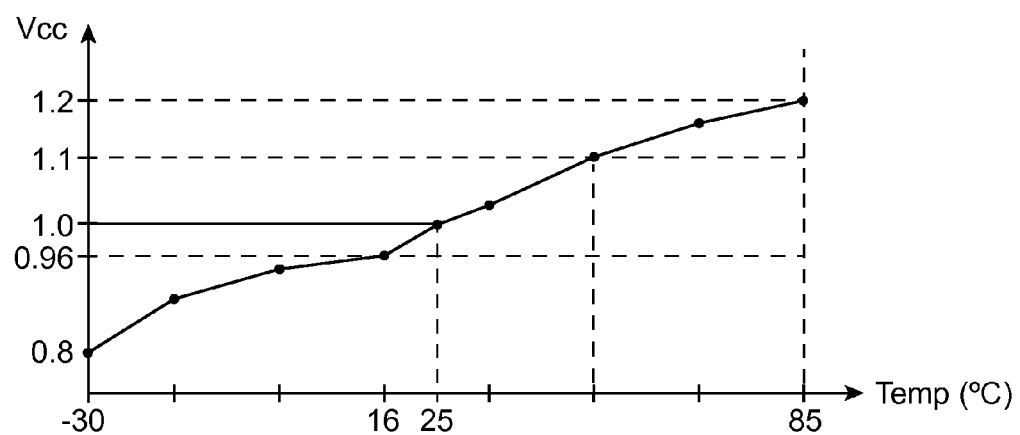
FIG. 11B is a plot showing temperature dependent power supply levels that may be supplied to the wireless communications circuitry in the electronic device of FIG. 1 for compensating radio-frequency output power offsets in accordance with an embodiment of the present invention.

The example described in connection with FIG. 11B in which the gain of power amplifier circuitry 20 is adjusted by varying Vcc based on the calibrated offset compensation values is merely illustrative and does not serve to limit the scope of the present invention. If desired, the offset compensation values obtained during calibration operations may be used to adjust the gain of power amplifier circuitry 20 in any suitable fashion by providing appropriate control signals via path 44.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of using a test system to calibrate an electronic device, wherein the test system includes a radio communication tester and a test chamber in which the electronic device is placed during calibration, the method comprising:

while the test chamber is set to provide a first a first internal chamber temperature, obtaining baseline measurement data from the electronic device with the radio communication tester;

while the test chamber is set to provide a second internal chamber temperature that is different than the first internal chamber temperature, obtaining additional measurement data from the electronic device with the radio communication tester, wherein the electronic device includes wireless communications circuitry configured to generate radio-frequency test signals during calibration, and wherein obtaining the baseline measurement data and the additional measurement data comprises obtaining radio-frequency output power measurements associated with the radio-frequency test signals using the radio communication tester; and computing calibration data for the electronic device by comparing the additional measurement data to the baseline measurement data.

2. The method defined in claim 1, wherein comparing the additional measurement data to the baseline measurement data comprises computing differences between the additional measurement data and the baseline measurement data.

3. The method defined in claim 1, further comprising:
storing the calibration data in the electronic device, wherein the electronic device is configured to operate in normal user operation using settings based on the stored calibration data.

4. The method defined in claim 1, wherein the electronic device includes power amplifier circuitry, and wherein the test system further includes a test host, the method further comprising:
with the test host, configuring the power amplifier circuitry in the electronic device to output radio-frequency test signals using a plurality of radio-frequency gain settings at desired frequencies.

5. The method defined in claim 1, wherein the test system further includes a power supply unit, the method further comprising:
with the power supply unit, proving power to the electronic device during calibration; and
with the power supply unit, monitoring power consumption levels for the electronic device during calibration.

6. The method defined in claim 1, wherein the second internal chamber temperature comprises a target temperature level in a list of predetermined target temperatures levels to be calibrated, the method further comprising:
calibrating the electronic device while setting the test chamber to each target temperature level in the list of predetermined target temperature levels; and
computing calibration data for each target temperature level in the list of predetermined target temperature levels.

7. The method defined in claim 1, wherein the electronic device includes power amplifier circuitry, wherein computing the calibration data for the electronic device comprises computing output power offset compensation values for the power amplifier circuitry, and wherein the output power offset compensation values configure the power amplifier circuitry to output radio-frequency signals at satisfactory levels across different device operating temperatures.

8. The method defined in claim 1, wherein the electronic device includes power amplifier circuitry, antenna structures, and a transmission line path interposed between the power amplifier circuitry and the antenna structures, and the method further comprising:
coupling the radio communication tester to the transmission line path using a radio-frequency test probe, wherein the antenna structures are electrically decoupled from the power amplifier circuitry when the radio-frequency test probe is coupled to the transmission line path.

9. A method of using a test system to calibrate an electronic device having a temperature sensing circuit operable to provide a sensor output value, wherein the test system includes a test chamber in which the electronic device is placed during calibration, the method comprising:
while the test chamber is set to provide a first internal chamber temperature, obtaining a baseline sensor output value using the temperature sensing circuit in the electronic device; and
computing target sensor output values for each target calibration temperature level in a predetermined list of target calibration temperature levels based on the baseline sensor output value and a temperature coefficient associated with the temperature sensing circuit, wherein each of the computed target sensor output values specifies a respective value for which the sensor output value generated by the temperature sensing circuit has to match at a corresponding target calibration temperature level in the predetermined list of target calibration temperature levels.

10. The method defined in claim 9, wherein the temperature sensing circuit comprises a thermistor, and wherein the temperature coefficient associated with the thermistor is a fixed value.

11. The method defined in claim 9, further comprising:
configuring the test chamber to provide a second internal chamber temperature that is different than the first internal temperature; and
while the test chamber is configured to provide the second internal chamber temperature, obtaining a measured sensor output value using the temperature sensing circuit.

12. The method defined in claim 11, wherein the test system further includes a radio communication tester, the method further comprising:
determining whether the measured sensor output value is sufficiently close to a corresponding one of the target calibration sensor output values;
in response to determining that the measured sensor output value is sufficiently close to the corresponding target calibration sensor output value, using the radio communication tester to obtain desired radio-frequency measurements from the electronic device; and
in response to determining that the measured sensor output value is not sufficiently close to the corresponding target calibration sensor output value, reconfiguring the test chamber to provide a third internal chamber temperature that is different than the second internal chamber temperature.

13. The method defined in claim 10, wherein the test system further includes a radio communication tester, the method further comprising:
while the test chamber is set to provide the first internal chamber temperature, using the radio communication tester to obtain baseline radio-frequency measurements from the electronic device; and
while the test chamber is configured such that the sensor output value is sufficiently close to one of the target sensor output values, using the radio communication tester to obtain additional radio-frequency measurements from the electronic device.

14. The method defined in claim 13, wherein the electronic device further includes wireless communications circuitry, the method further comprising:

computing calibration data for the wireless communications circuitry by comparing the additional radio-frequency measurements to the baseline radio-frequency measurements.

15. A method of operating an electronic device that includes wireless communications circuitry and a temperature sensing circuit, the method comprising:

storing calibration settings on the electronic device;

with the temperature sensing circuit, monitoring an operating temperature for the electronic device;

in response to detecting a first operating temperature, configuring the wireless communications circuitry in a first gain mode by supplying at least a portion of the wireless communications circuitry with a first power supply voltage according to the stored calibration settings; and in response to detecting a second operating temperature that is greater than the first operating temperature, configuring the wireless communications circuitry in a second gain mode by supplying the portion of the wireless communications circuitry with a second power supply voltage that is greater than the first power supply voltage according to the stored calibration settings.

16. The method defined in claim 15, wherein the temperature sensing circuit comprises a thermistor having a constant temperature coefficient.

17. The method defined in claim 15, wherein the wireless communications circuitry includes power amplifier circuitry having a given number of amplifier gain stages, and wherein configuring the wireless communications circuitry using the selected gain setting comprises selectively activating at least some of the amplifier gain stages.

18. The method defined in claim 17, wherein the electronic device further includes adjustable power supply circuitry, and wherein configuring the wireless communications circuitry using the selected gain setting further comprises providing an adjustable power supply voltage to the power amplifier circuitry with the adjustable power supply circuitry.

19. The method defined in claim 15, wherein the wireless communications circuitry includes power amplifier circuitry, wherein storing the calibration settings comprises storing power amplifier output power offset compensation values corresponding to different device operating temperatures, and wherein configuring the wireless communications circuitry using the selected gain setting comprises adjusting the power amplifier circuitry based on a corresponding power amplifier output power offset compensation value to ensure that the power amplifier circuitry is outputting radio-frequency signals at satisfactory signal levels.

\* \* \* \* \*